(12) United States Patent
Kimura et al.

(10) Patent No.: US 12,046,488 B2
(45) Date of Patent: Jul. 23, 2024

(54) SEMICONDUCTOR MANUFACTURING APPARATUS AND WAFER HOLDING TABLE FOR SEMICONDUCTOR MANUFACTURING APPARATUS

(71) Applicant: Sumitomo Electric Industries, Ltd., Osaka (JP)

(72) Inventors: Koichi Kimura, Itami (JP); Akira Mikumo, Itami (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 582 days.

(21) Appl. No.: 17/401,333

(22) Filed: Aug. 13, 2021

(65) Prior Publication Data
US 2021/0375647 A1 Dec. 2, 2021

Related U.S. Application Data

(63) Continuation of application No. 16/078,601, filed as application No. PCT/JP2017/037468 on Oct. 17, 2017, now Pat. No. 11,127,605.

(30) Foreign Application Priority Data

Nov. 29, 2016 (JP) ................................. 2016-230806

(51) Int. Cl.
*H01L 21/67* (2006.01)
*H01J 37/32* (2006.01)
(Continued)

(52) U.S. Cl.
CPC .. *H01L 21/67103* (2013.01); *H01L 21/68757* (2013.01); *H01L 21/68785* (2013.01);
(Continued)

(58) Field of Classification Search
CPC ......... H01L 21/67103; H01L 21/68757; H01L 21/68785; H01L 21/67248; H01L 21/6833;
(Continued)

(56) References Cited

U.S. PATENT DOCUMENTS

| 5,456,757 A | 10/1995 | Aruga et al. |
| 11,127,605 B2 * | 9/2021 | Kimura ............. H01L 21/68757 |

(Continued)

FOREIGN PATENT DOCUMENTS

| JP | 2003-017224 A | 1/2003 |
| JP | 2004-152865 A | 5/2004 |

(Continued)

OTHER PUBLICATIONS

Kimura et al., JP2017022284A filing, Espacenet translation, Wafer Holder, Jul. 13, 2015, Description, Drawings (Year: 2015).

(Continued)

*Primary Examiner* — Robert G Bachner
(74) *Attorney, Agent, or Firm* — XSENSUS LLP

(57) ABSTRACT

A wafer holder includes a mounting table that has a mounting surface for a workpiece at a top, a supporting member that supports the mounting table from a lower side, a first cylindrical member one end of which is joined hermetically to a lower surface of the mounting table, and a second cylindrical member that is provided inside the first cylindrical member and one end of which is joined hermetically to the lower surface of the mounting table.

18 Claims, 3 Drawing Sheets

(51) Int. Cl.
*H01L 21/683* (2006.01)
*H01L 21/687* (2006.01)
*H05B 3/28* (2006.01)

(52) U.S. Cl.
CPC ........ *H05B 3/283* (2013.01); *H01J 37/32724* (2013.01); *H01J 2237/002* (2013.01); *H01J 2237/2065* (2013.01); *H01J 2237/24585* (2013.01); *H01L 21/67248* (2013.01); *H01L 21/6833* (2013.01)

(58) Field of Classification Search
CPC .. H05B 3/283; H05B 3/18; H05B 3/74; H01J 37/32724; H01J 2237/002; H01J 2237/2065; H01J 2237/24585
See application file for complete search history.

(56) References Cited

U.S. PATENT DOCUMENTS

| | | |
|---|---|---|
| 2001/0042744 A1 | 11/2001 | Tachikawa et al. |
| 2003/0066608 A1 | 4/2003 | Natsuhara et al. |
| 2004/0050496 A1 | 3/2004 | Iwai et al. |
| 2004/0182321 A1 | 9/2004 | Kuibira |
| 2004/0194710 A1 | 10/2004 | Hanamachi et al. |
| 2005/0022744 A1 | 2/2005 | Natsuhara et al. |
| 2009/0139979 A1 | 6/2009 | Komatsu |
| 2012/0211484 A1 | 8/2012 | Zhou et al. |
| 2014/0356539 A1 | 12/2014 | Inatomi et al. |
| 2016/0002779 A1 | 1/2016 | Lin et al. |

FOREIGN PATENT DOCUMENTS

| | | |
|---|---|---|
| JP | 2004-307939 A | 11/2004 |
| JP | 2006-245610 A | 9/2006 |
| JP | 2011-61040 A | 3/2011 |
| JP | 2013-251354 A | 12/2013 |
| JP | 2017-022284 A | 1/2017 |
| WO | 2007/020872 A1 | 2/2007 |

OTHER PUBLICATIONS

Search Report in the corresponding International Patent Application No. PCT/JP2017/037468 dated Jan. 9, 2018.

\* cited by examiner

SEMICONDUCTOR MANUFACTURING APPARATUS AND WAFER HOLDING TABLE FOR SEMICONDUCTOR MANUFACTURING APPARATUS

CROSS-REFERENCE TO THE RELATED APPLICATIONS

This application is a continuation of U.S. application Ser. No. 16/078,601, filed Aug. 21, 2018, which is a national stage of PCT/JP2017/037468, filed Oct. 17, 2017, which claims the priority under 35 U.S.C § 119(a) to Japanese Patent Application No. 2016-230806 filed Nov. 29, 2016, the entire contents of each are hereby incorporated herein by reference.

TECHNICAL FIELD

The present disclosure relates to a wafer holder.

BACKGROUND ART

In a semiconductor manufacturing apparatus that manufactures a semiconductor device such as an LSI, various kinds of thin-film processing, such as film deposition represented by CVD or sputtering and etching, is performed on a semiconductor wafer, which is a workpiece. Such thin-film processing is usually performed on a heated semiconductor wafer. Therefore, a wafer heater, also called susceptor, on which a semiconductor wafer to be processed is mounted and is heated from the lower surface thereof is typically provided in a chamber in which the thin-film processing is to be performed.

The above wafer heater includes, as disclosed by Japanese Unexamined Patent Application Publication No. 2003-17224, for example, a wafer mounting table that is a ceramic disc-like member having a flat wafer-mounting surface at the top thereof, and a cylindrical supporting member that supports the wafer mounting table from the lower side. The semiconductor wafer is heated by a resistance heating element embedded in the wafer mounting table. The wafer mounting table may further has therein a radio-frequency (RF) electrode that generates plasma or an electrode of an electrostatic chuck (ESC) that electrically attracts and secures the semiconductor wafer to the wafer mounting surface.

SUMMARY OF INVENTION

A wafer holder includes a mounting table that has a mounting surface for a workpiece at a top, a supporting member that supports the mounting table from a lower side, a first cylindrical member one end of which is joined hermetically to a lower surface of the mounting table, and a second cylindrical member that is provided inside the first cylindrical member and one end of which is joined hermetically to the lower surface of the mounting table.

DESCRIPTION OF EMBODIMENTS

Figure 1:
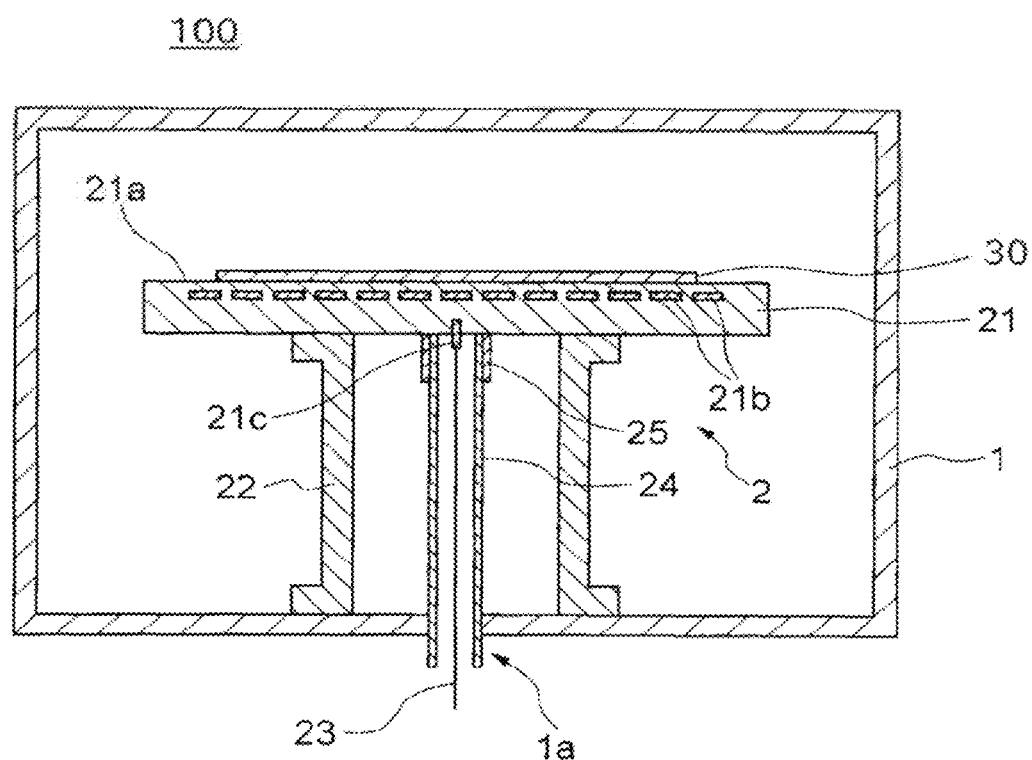
FIG. 1 is a schematic vertical sectional view of a wafer heater as a specific example of the wafer holder according to the present disclosure.

As described above, the wafer mounting table of the wafer heater has therein an electrode of a resistance heating element or the like. Therefore, a terminal part that feeds electricity to the electrode is provided on the lower surface of the wafer mounting table. In some cases, the wafer mounting table is provided with a temperature sensor such as a thermocouple. In such a case also, a terminal part of the temperature sensor is provided on the lower surface of the wafer mounting table. While the semiconductor wafer is processed, such terminal parts are heated to about 600° C. together with the wafer mounting table. Therefore, the terminal parts need to be protected from corrosive gas such as halogen gas that is to be introduced as a reactant gas used in CVD, etching, or the like into the chamber.

Accordingly, a configuration may be proposed in which the terminal part of the electrode provided to the resistance heating element or the like and a lead wire connected to the terminal part are housed in a cylindrical member, with two ends of the cylindrical member being sealed hermetically on the bottom surface of the wafer mounting table and the floor surface of the chamber, respectively. In general, however, since the wafer mounting table is repeatedly heated and cooled, the joining part between the cylindrical member and the wafer mounting table may be damaged by the heating cycle. Moreover, during maintenance work, a lateral external stress may be applied to the cylindrical member and may damage the joining part.

In addition, the wafer mounting table may be provided therein with a coolant circulation channel for cooling or a groove for attracting the semiconductor wafer on the wafer mounting surface with a vacuum. It is necessary to provide, in the lower surface of the wafer mounting table, a channel for supplying/draining the coolant in the former case or a channel that communicates with the groove in the latter case. Such a channel also needs to be assuredly sealed hermetically on the wafer mounting table so that no leakage occurs. However, the stress generated by the above heating cycle or the like occasionally leads to damage. The present disclosure has been conceived in view of the above circumstances in the background art and provides a wafer holder including a mounting table for a workpiece and a supporting member that supports the mounting table, the wafer holder having a structure that is less likely to be damaged even if a cylindrical member provided to the mounting table receives any stress generated in a heating cycle or the like.

First, embodiments of the present disclosure will be listed and described. The wafer holder according to the present disclosure includes a mounting table that has a mounting surface for a workpiece at the top, a supporting member that supports the mounting table from the lower side, a first cylindrical member one end of which is joined hermetically to the lower surface of the mounting table, and a second cylindrical member that is provided inside the first cylindrical member and one end of which is joined hermetically to the lower surface of the mounting table. Thus, the strength at a joining part between the mounting table and the second cylindrical member can be increased.

The above wafer holder may include an electrode at least part of which is embedded in the mounting table, and the electrode may be housed in the second cylindrical member. Furthermore, the above wafer holder may include a temperature sensor at least part of which is embedded in the mounting table; and a lead wire that is drawn from the temperature sensor, and the temperature sensor and the lead wire may be housed in the second cylindrical member. Furthermore, the above wafer holder may include an electrode at least part of which is embedded in the mounting table; a temperature sensor at least part of which is embedded in the mounting table; and a lead wire that is drawn from the temperature sensor, and the electrode, the temperature sensor, and the lead wire may be housed in the second cylindrical member. Thus, the electrode, the temperature sensor, and the lead wire thereof can be isolated from a corrosive atmosphere. Alternatively, the mounting table may have a channel therein, the mounting surface may have a groove, and the inside of the second cylindrical member may serve as a channel that communicates with the channel or the groove. Thus, leakage between the channel in the second cylindrical member and the outside can be prevented assuredly.

Furthermore, in the above wafer holder, the mounting table may be made of ceramic and have a disc-like shape for mounting a semiconductor wafer, and the wafer holder may further include a resistance heating element embedded in the mounting table. In such a case, the reliability of a semiconductor manufacturing apparatus that includes the wafer holder can be improved. The term "disc-like shape" does not imply a geometrically accurate circular plate but implies a shape that is recognized as a circular plate in its appearance. Hereinafter, such a shape may also be described as "substantially disc-like shape."

Now, a wafer heater 2 included in a semiconductor manufacturing apparatus 100 illustrated in FIG. 1 will be described as a specific example of the wafer holder according to the present disclosure. The semiconductor manufacturing apparatus 100 illustrated in FIG. 1 basically includes a chamber 1 in which thin-film processing such as etching or CVD is performed on a semiconductor wafer 30, and the wafer heater 2 provided in the chamber 1. The wafer heater 2 includes a wafer mounting table 21 that has a wafer mounting surface 21a at the top, preferably the wafer mounting table 21 being made of ceramic and having a substantially disc-like shape; and a supporting member 22 that supports the wafer mounting table 21 from the lower side, preferably the supporting member 22 being made of ceramic and having a substantially cylindrical shape. The ceramic as a material suitable for the wafer mounting table 21 and the supporting member 22 may be, for example, aluminum nitride, silicon nitride, silicon carbide, aluminum oxide, or the like.

The wafer mounting table 21 has a resistance heating element 21b having a predetermined circuit pattern and embedded therein in such a manner as to extend parallel to the wafer mounting surface 21a. The mode of the resistance heating element 21b is not specifically limited and may be obtained by, for example, patterning a piece of metal foil such as stainless foil, or performing screen printing with paste containing metal powder such as tungsten and baking the paste. Alternatively, the resistance heating element 21b may be a molybdenum coil. The wafer mounting table 21 further has a thermocouple 21c provided therein. Part of the thermocouple 21c projects from the lower surface of the wafer mounting table 21 inside the supporting member 22. An electrode, which is not illustrated, connected to two ends of the resistance heating element 21b also projects from the lower surface of the wafer mounting table 21 inside the supporting member 22.

One end of a lead wire 23 is connected to the thermocouple 21c. The lead wire 23 runs inside the supporting member 22 up to the lower end of the supporting member 22, passes through a through hole 1a provided in the bottom face of the chamber 1, and is drawn to the outside of the chamber 1. The two ends of the supporting member 22 are each bent outward to have a flange shape. The upper end face of the flange shape at the upper end of the supporting member 22 may be joined to the lower surface of the wafer mounting table 21 by sintering or may be joined to the lower surface of the wafer mounting table 21 with connecting means such as screws that extend through the flange-shaped portion. On the other hand, the lower end of the supporting member 22 may be joined to the bottom surface of the chamber 1 as in the same manner as for the upper end thereof, preferably with connecting means such as a clamp in such a manner as to be detachable.

A second cylindrical member 24 that houses the thermocouple 21c and the lead wire 23 thereof is provided inside the supporting member 22. Preferably, the second cylindrical member 24 is made of ceramic and has an outside diameter of about 6 to 30 mm and a thickness of about 0.5 to 5 mm. The upper end of the second cylindrical member 24 is joined hermetically to the lower surface of the wafer mounting table 21. The lower end of the second cylindrical member 24 passes through the through hole 1a and projects from the bottom of the chamber 1. A first cylindrical member 25 is provided at the connection between the second cylindrical member 24 and the wafer mounting table 21 (on the outer side of the second cylindrical member 24). Preferably, the first cylindrical member 25 is made of ceramic and has an inside diameter of about 6 to 30 mm, a thickness of about 0.5 to 5 mm, and a length of about 1 to 30 mm. The first cylindrical member 25 is shorter than the second cylindrical member 24. One end, or the upper end, of the first cylindrical member 25 is joined hermetically to the lower surface of the wafer mounting table 21. That is, the wafer heater 2 includes the second cylindrical member 24 that is provided inside the first cylindrical member 25 and one end of which is joined hermetically to the lower surface of the mounting table.

In such a configuration, even if a stress acting in a direction perpendicular to the direction in which the second cylindrical member 24 extends is applied to the second cylindrical member 24 in the above-described heating cycle or the like, the force acting on the joining part between the upper end of the second cylindrical member 24 and the lower surface of the wafer mounting table 21 can be dispersed between the joining part at the upper end of the second cylindrical member 24 and the joining part at the upper end of the first cylindrical member 25. Therefore, the strength against the above stress can be increased. Accordingly, high hermeticness can be assuredly provided on the inside of the second cylindrical member 24. Consequently, the reliability of the semiconductor manufacturing apparatus 100 including the wafer heater 2 is improved.

Figure 2A:
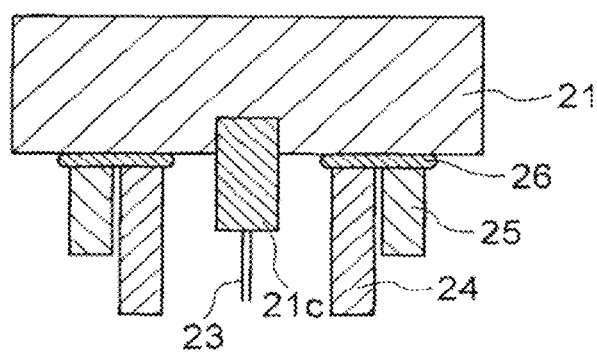
FIG. 2A is a partial sectional diagram illustrating a first embodiment of an hermetic joining part of a first cylindrical member and a second cylindrical member included in the wafer heater illustrated in FIG. 1.
Figure 2B:
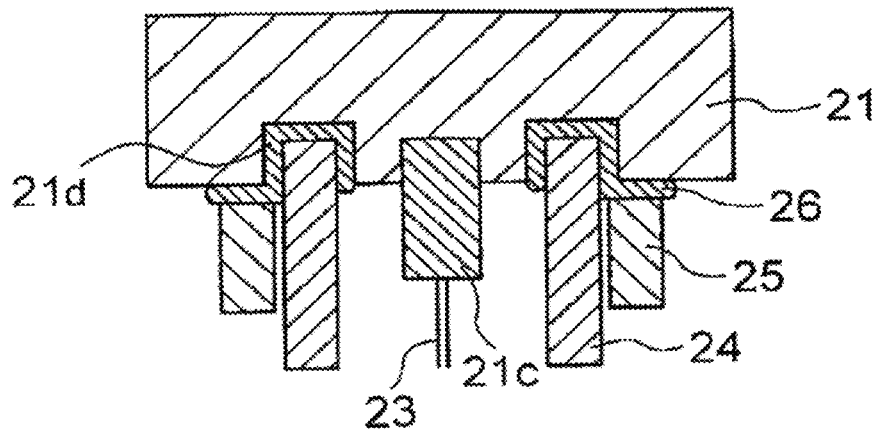
FIG. 2B is a partial sectional diagram illustrating a second embodiment of the hermetic joining part of the first cylindrical member and the second cylindrical member included in the wafer heater illustrated in FIG. 1.
Figure 2C:
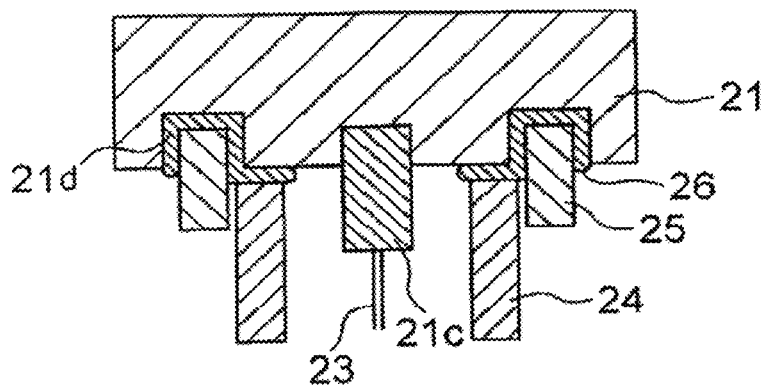
FIG. 2C is a partial sectional diagram illustrating a third embodiment of the hermetic joining part of the first cylindrical member and the second cylindrical member included in the wafer heater illustrated in FIG. 1.
Figure 2D:
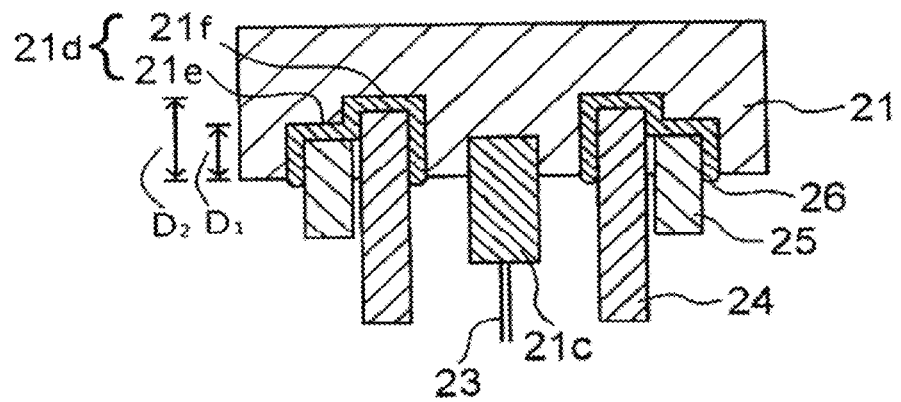
FIG. 2D is a partial sectional diagram illustrating a fourth embodiment of the hermetic joining part of the first cylindrical member and the second cylindrical member included in the wafer heater illustrated in FIG. 1.

As illustrated in FIGS. 2A to D (first to fourth embodiments), the upper end of the second cylindrical member 24 and the upper end of the first cylindrical member 25 are joined to the lower surface of the wafer mounting table 21 preferably with a sealing member 26 made of glass or the like that has a sealing function. As shown in FIGS. 2A thru 2D, the lower surface is a downwardly facing surface of the wafer mounting table 12. In the joining with the sealing member 26, as illustrated in FIG. 2A (the first embodiment), the upper ends of the second cylindrical member 24 and the first cylindrical member 25 may be aligned with each other on the lower surface of the wafer mounting table 21, preferably. Alternatively, as illustrated in FIGS. 2B to D, an annular groove 21d may be provided in the lower surface of the wafer mounting table 21, so that the upper end of at least one of the second cylindrical member 24 and the first cylindrical member 25 can be fitted into the annular groove 21d.

In the configuration illustrated in FIG. 2A, since the wafer mounting table 21 has no groove in the lower surface thereof, the manufacturing cost can be reduced. If higher strength is required, the configuration illustrated in FIG. 2B (the second embodiment) or FIG. 2C (the third embodiment) is preferable. In the configuration illustrated in FIG. 2B, only the second cylindrical member 24 is fitted in the annular groove 21d. In the configuration illustrated in FIG. 2C, only the first cylindrical member 25 is fitted in the annular groove 21d. In the configuration illustrated in FIG. 2D (the fourth embodiment), both the second cylindrical member 24 and the first cylindrical member 25 are fitted in the annular groove 21d. Further, in FIG. 2D, the annular groove 21d has an annular first portion 21e having a first depth $D_1$ from the lower surface of the mounting table 21 and an annular second portion 21f having a second depth $D_2$ deeper than the first depth $D_1$. The case where both the second cylindrical member 24 and the first cylindrical member 25 are fitted in the groove is not limited to the case illustrated in FIG. 2D where the second cylindrical member 24 is fitted more deeply into the groove 21d than the first cylindrical member 25. The relationship may be reversed as shown in FIG. 2C, or the ends of the two may be fitted by the same depth.

Figure 3:
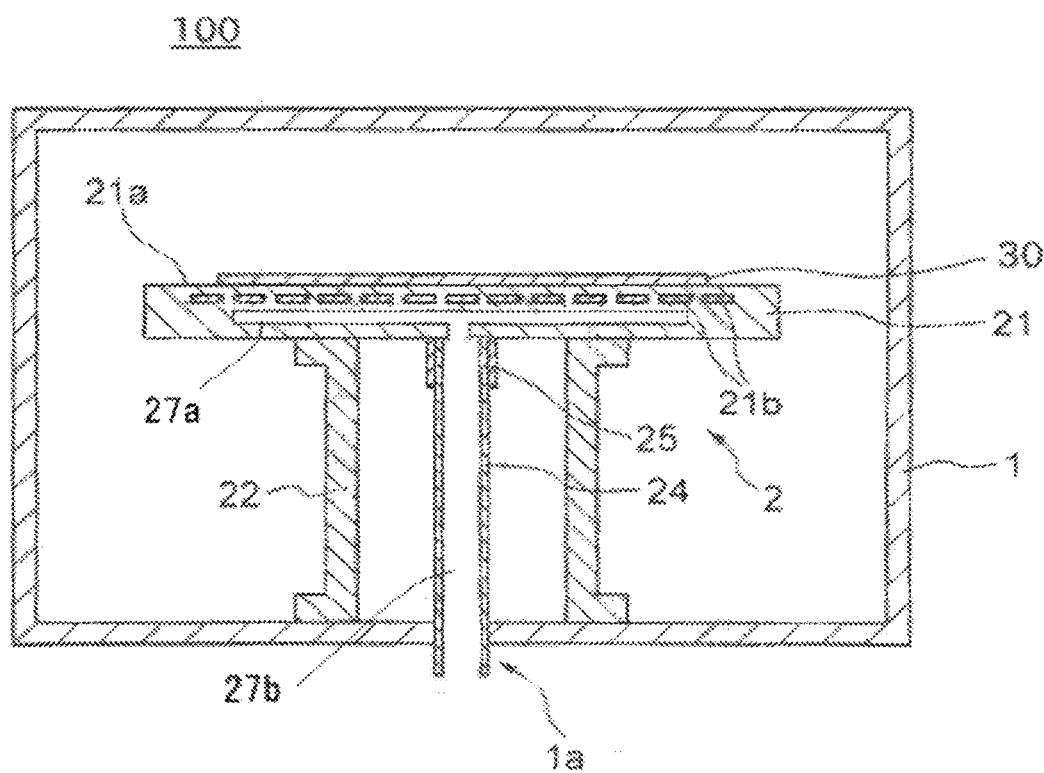
FIG. 3 is a schematic vertical sectional view illustrating a fifth embodiment of the wafer holder illustrated in FIG. 1.

The above description concerns the wafer heater 2 as a wafer holder in which the thermocouple 21c and the lead wire 23 thereof as an electric wire are housed in the second cylindrical member 24. The electrodes provided to relevant elements such as the resistance heating element 21b embedded in the wafer mounting table 21, an RF circuit, and an ESC circuit, and feeder lines for the electrodes may also be housed in the second cylindrical member 24. Alternatively, the space inside the second cylindrical member 24 may be used as a channel 27b that communicates with a coolant circulation channel 27a, as shown in FIG. 3, or a chucking groove provided in the wafer mounting table 21 or in the wafer mounting surface 21a. The second cylindrical member 24 whose joining part is reinforced by the first cylindrical member 25 may be provided either inside the supporting member 22 or outside the supporting member 22.

Furthermore, the two ends of the supporting member 22 may be sealed hermetically, so that the inside of the supporting member 22 can be isolated from the outside of the supporting member 22 that is to be filled with a corrosive atmosphere. In such a case, the inside of the supporting member 22 may be filled with an inert gas atmosphere. If the electrodes and other relevant elements are housed in the second cylindrical member 24 described above, the inside of the second cylindrical member 24 may be filled with an inert gas atmosphere. The inert gas is not specifically limited, as long as the gas does not react to degrade the materials forming the electrodes and relevant elements. Namely, a rare gas such as He, Ne, Ar, Kr, Xe, or Rn; a $N_2$ gas; or the like may be employed. Among such gases, $N_2$ or Ar is preferable in terms of cost and so forth.

EXAMPLES

A slurry was obtained from 99.5 parts by mass of aluminum nitride powder with 0.5 parts by mass of yttrium oxide as a sintering aid, a binder, and an organic solvent that were added thereto and mixed altogether in a ball mill. The slurry thus obtained was sprayed by a spray-drying method, whereby granules were obtained. The granules were pressed into two compacts of the same shape. These compacts were subjected to degreasing in a nitrogen atmosphere at 700° C. Then, the compacts were sintered in the nitrogen atmosphere at 1850° C. Thus, two sintered compacts of aluminum nitride were obtained. The sintered compacts thus obtained were each processed into a disc-like shape having a diameter of 330 mm and a thickness of 8 mm. In this step, the surface roughness in Ra was 0.8 µm, and the flatness was 50 µm.

To form a resistance heating element on one side of one of the two sintered compacts of aluminum nitride, W (tungsten) paste was applied thereto by screen printing such that lines were formed with a uniform width of 4 mm. Then, the paste was subjected to degreasing in a nitrogen atmosphere at 700° C., and was sintered in the nitrogen atmosphere at 1830° C. Thus, a resistance heating element having a substantially concentric circuit pattern was obtained. Subsequently, an adhesive material chiefly composed of adhesive aluminum nitride was applied to one side of the other sintered compact of aluminum nitride and was subjected to degreasing. Then, the two sintered compacts of aluminum nitride were stacked one on top of the other such that the resistance heating element was covered, and were joined to each other. Two holes were provided by spot facing on one side of the above-obtained joined compact such that the holes reach two respective ends of the resistance heating element, and electrodes made of W (tungsten) were fitted into the respective holes in such a manner as to come into contact with the respective ends of the resistance heating element.

As illustrated in FIG. 2D, a hole for the thermocouple was provided on the same side of the joined compact by spot facing, and the thermocouple 21c was fitted thereinto. Furthermore, an annular groove for receiving the upper ends of the below-described second cylindrical member 24 and the first cylindrical member 25 was provided by spot facing around the spot-faced hole for the thermocouple. A step was formed at the bottom of the annular groove such that the groove for the second cylindrical member 24 had a depth of 5 mm and the groove for the first cylindrical member 25 had a depth of 3 mm.

One end of a cylindrical AlN supporting member 22 having flange portions at two ends thereof and having an inside diameter of 60 mm, a height of 150 mm, and a thickness of 2 mm was joined, with screws, to the surface of the above-obtained wafer mounting table 21 in which the W electrodes and the thermocouple 21c had been fitted. The gap between the flange portion and the joining surface of the wafer mounting table was hermetically sealed with an O-ring. Furthermore, feeder lines were connected to the electrodes projecting from the lower surface of the wafer mounting table 21 inside the supporting member.

The wafer mounting table 21 to which the one end of the supporting member 22 was joined was put into a chamber of a CVD apparatus, and the other end of the supporting member 22 was fixed to the bottom of the chamber by using a clamp, with an O-ring hermetically sealing the end. Furthermore, as illustrated in FIG. 1 and FIG. 2D, the upper end of a ceramic second cylindrical member 24 provided for housing the thermocouple 21c and the lead wire 23 thereof and having an outside diameter of 10 mm, a thickness of 2 mm, and a length of 175 mm was fitted into the annular groove provided in the lower surface of the wafer mounting table 21. Furthermore, a ceramic first cylindrical member 25 having an outside diameter of 14 mm, a thickness of 2 mm, and a length of 8 mm was provided at the top of the second cylindrical member 24, and the upper end of the first cylindrical member 25 was fitted into the annular groove provided in the lower surface of the wafer mounting table 21. That is, the second cylindrical member 24 was placed on the inner side of the first cylindrical member 25.

Sealing glass was fitted into the annular groove, and the upper ends of the second cylindrical member 24 and the first cylindrical member 25 and the lower surface of the wafer mounting table 21 were hermetically joined to each other by melting the sealing glass. A lower portion of the second cylindrical member 24 extends through a through hole provided at the bottom of the chamber, and the gap between the through hole and the outer peripheral surface of the second cylindrical member 24 was hermetically sealed with an O-ring. Thus, a wafer heater 2 as Sample 1 was manufactured.

For comparison, a wafer heater as Sample 2 was also manufactured in the same manner as for Sample 1, except that only the second cylindrical member 24 but the first cylindrical member 25 was used, and the thermocouple 21c and the lead wire 23 thereof were housed in the second cylindrical member 24. For each of the wafer heaters 2 of Samples 1 and 2, ten rounds of heating cycle were performed in which the temperature of the wafer mounting table 21 was raised and lowered repeatedly between room temperature and 500° C. by repeatedly turning on and off the power to the resistance heating element. Consequently, in Sample 1, the part between the second cylindrical member 24 and the lower surface of the wafer mounting table 21 was kept sealed hermetically. In contrast, in Sample 2, a leakage occurred at the part between the second cylindrical member 24 and the lower surface of the wafer mounting table 21.

The embodiments disclosed herein are only exemplary in all respects, and it should be understood that the embodiments do not limit any aspects. The present invention is not limited to the above exemplary embodiments but is defined by the appended claims, including all equivalents to the claims and all modifications made to the claims within the scope thereof.

The invention claimed is:

1. A semiconductor manufacturing apparatus comprising:
a mounting table having an upper surface that serves as a mounting surface for a semiconductor wafer, the mounting table including a resistance heating element inside, a first cylindrical member, and a second cylindrical member that is positioned inside the first cylindrical member in a coaxial relationship; and
a sealing member that hermetically joins a first end of the first cylindrical member and a second end of the second cylindrical member to the mounting table, wherein
the mounting table has an annular groove in a lower surface thereof, and
at least one of the first end of the first cylindrical member and the second end of the second cylindrical member are positioned in the annular groove so as to be inset within the mounting table such that forces applied to the second cylindrical member in a direction perpendicular to a lengthwise direction of the second cylindrical member are dispersed between the hermetically joining of the second end of the second cylindrical member to the mounting table and the hermetically joining of the first end of the first cylindrical member to the mounting table.

2. The semiconductor manufacturing apparatus according to claim 1,
wherein the first cylindrical member has a first length, and the second cylindrical member has a second length, and
wherein the first length is shorter than the second length.

3. The semiconductor manufacturing apparatus according to claim 1, further comprising an electrode at least part of which is embedded in the mounting table, the electrode being housed in the second cylindrical member.

4. The semiconductor manufacturing apparatus according to claim 1, further comprising a temperature sensor at least part of which is embedded in the mounting table; and a lead wire that is drawn from the temperature sensor, wherein the temperature sensor and the lead wire are housed in the second cylindrical member.

5. The semiconductor manufacturing apparatus according to claim 1,
wherein the mounting table has a first channel inside, the mounting surface has a groove, and an inside of the second cylindrical member serves as a second channel that communicates with the first channel or the groove.

6. The semiconductor manufacturing apparatus according to claim 1,
wherein the mounting table is made of ceramic and has a disc-like shape, and
wherein the first cylindrical member and the second cylindrical member are made of ceramic and each have a cylindrical shape.

7. The semiconductor manufacturing apparatus according to claim 1, further comprising:
a cylindrical supporting member that supports the mounting table from a lower side,
wherein the first cylindrical member and the second cylindrical member are positioned inside the supporting member.

8. The semiconductor manufacturing apparatus of claim 1, wherein
the first end of the first cylindrical member is positioned in the annular groove of the mounting table and the second end of the second cylindrical member is positioned outside the annular groove of the mounting table.

9. The semiconductor manufacturing apparatus of claim 1, wherein
the first end of the first cylindrical member is positioned outside the annular groove of the mounting table and the second end of the second cylindrical member is positioned inside the annular groove of the mounting table.

10. The semiconductor manufacturing apparatus of claim 1, wherein
the first end of the first cylindrical member is positioned in the annular groove of the mounting table and the second end of the second cylindrical member is positioned inside the annular groove of the mounting table.

11. A wafer holding table for a semiconductor manufacturing apparatus, the wafer holding table comprising:
a mounting table having an upper surface that serves as a mounting surface for a semiconductor wafer, the mounting table including a resistance heating element inside, a first cylindrical member, and a second cylindrical member that is positioned inside the first cylindrical member in a coaxial relationship; and a sealing member that hermetically joins a first end of the first cylindrical member and a second end of the second cylindrical member to the mounting table, wherein the mounting table has an annular groove in a lower surface thereof, and at least one of the first end of the first cylindrical member and the second end of the second cylindrical member are positioned in the annular groove so as to be inset within the mounting table such that forces applied to the second cylindrical member in a direction perpendicular to a lengthwise direction of the second cylindrical member are dispersed between the hermetically joining of the second end of the second cylindrical member to the mounting table and the hermetically joining of the first end of the first cylindrical member to the mounting table.

12. The wafer holding table of claim 11, wherein
the first end of the first cylindrical member is positioned in the annular groove of the mounting table and the second end of the second cylindrical member is positioned outside the annular groove of the mounting table.

13. The wafer holding table of claim 11, wherein
the first end of the first cylindrical member is positioned outside the annular groove of the mounting table and the second end of the second cylindrical member is positioned inside the annular groove of the mounting table.

14. The wafer holding table of claim 11, wherein
the first end of the first cylindrical member is positioned in the annular groove of the mounting table and the second end of the second cylindrical member is positioned inside the annular groove of the mounting table.

15. The wafer holding table of claim 11,
wherein the first cylindrical member has a first length, and the second cylindrical member has a second length, and
wherein the first length is shorter than the second length.

16. The wafer holding table of claim 11,
wherein the mounting table has a first channel inside, the mounting surface has a groove, and an inside of the second cylindrical member serves as a second channel that communicates with the first channel or the groove.

17. The wafer holding table of claim 11,
wherein the mounting table is made of ceramic and has a disc-like shape, and
wherein the first cylindrical member and the second cylindrical member are made of ceramic and each have a cylindrical shape.

18. The wafer holding table of claim 11, further comprising:
a cylindrical supporting member that supports the mounting table from a lower side,
wherein the first cylindrical member and the second cylindrical member are positioned inside the supporting member.

* * * * *